(12) United States Patent
Abeles et al.

(10) Patent No.: US 7,477,670 B2
(45) Date of Patent: Jan. 13, 2009

(54) HIGH POWER DIODE LASER BASED SOURCE

(75) Inventors: Joseph H. Abeles, Middlesex, NJ (US);
Alan M. Braun, Lawrenceville, NJ (US); Viktor Borisovitch Khalfin, Hightstown, NJ (US); Martin H. Kwakernaak, New Brunswick, NJ (US); Ramon U. Martinelli, Hightstown, NJ (US); Hooman Mohseni, Wilmette, IL (US)

(73) Assignee: Sarnoff Corporation, Princeton, NJ (US)

( * ) Notice: Subject to any disclaimer, the term of this patent is extended or adjusted under 35 U.S.C. 154(b) by 207 days.

(21) Appl. No.: 11/140,602

(22) Filed: May 27, 2005

(65) Prior Publication Data
US 2007/0036190 A1    Feb. 15, 2007

Related U.S. Application Data

(63) Continuation-in-part of application No. 11/002,403, filed on Dec. 2, 2004.

(60) Provisional application No. 60/575,048, filed on May 27, 2004, provisional application No. 60/575,049, filed on May 27, 2004.

(51) Int. Cl.
*H01S 5/00*   (2006.01)

(52) U.S. Cl. ............... 372/50.12; 372/50.1; 372/50.22

(58) Field of Classification Search .............. 372/50.12, 372/50.1, 50.22, 101, 102, 97
See application file for complete search history.

(56) References Cited

U.S. PATENT DOCUMENTS

| | | | | | |
|---|---|---|---|---|---|
| 4,872,744 | A | * | 10/1989 | Abeles et al. | 359/276 |
| H001570 | H | * | 8/1996 | Lux et al. | 257/25 |
| 5,764,677 | A | * | 6/1998 | Scheps | 372/54 |
| 5,930,280 | A | * | 7/1999 | Rossi et al. | 372/50.1 |
| 5,963,358 | A | * | 10/1999 | Shields | 359/248 |
| 6,411,642 | B1 | * | 6/2002 | Mazed | 372/103 |
| 6,625,182 | B1 | * | 9/2003 | Kuksenkov et al. | 372/19 |
| 6,816,525 | B2 | * | 11/2004 | Stintz et al. | 372/45.01 |
| 2002/0051615 | A1 | * | 5/2002 | Walpole et al. | 385/131 |
| 2003/0147438 | A1 | * | 8/2003 | Abeles | 372/45 |
| 2005/0129084 | A1 | * | 6/2005 | Kamp et al. | 372/96 |

* cited by examiner

*Primary Examiner*—Minsun Harvey
*Assistant Examiner*—Kinam Park
(74) *Attorney, Agent, or Firm*—Lowenstein Sandler PC

(57) ABSTRACT

A high power laser system including: a plurality of emitters each including a large area waveguide and a plurality of quantum well regions optically coupled to the large area waveguide, wherein each of the quantum well regions exhibits a low modal overlap with the large area waveguide; a collimator optically coupled to the emitters; a diffraction grating optically coupled through the collimator to the emitters; and, an output coupler optically coupled through the diffraction grating to the emitters.

27 Claims, 10 Drawing Sheets

| | | | |
|---|---|---|---|
| ▨ p-metal | | ▭ p-contact layer | |
| ▧ silicon nitride | | ▨ active layer | |
| ▨ n-metal | | ▨ InGaP etch stop | |
| ▨ interconnect metal | | ▨ n-contact layer | | ered # HIGH POWER DIODE LASER BASED SOURCE

RELATED APPLICATIONS

This Application claims priority of U.S. patent application Ser. No. 60/575,048, filed May 27, 2004, entitled HIGH POWER DIODE LASER AMPLIFIER CONSISTING OF MULTIPLE STRIPES and 60/575,049, filed May 27, 2004, entitled LARGE OPTICAL CAVITY LASER WITH PRIMARILY UNDOPED OPTICAL CAVITY; and, is a continuation-in-part application of U.S. patent application Ser. No. 11/002,403, filed Dec. 2, 2004, entitled VERTICALLY COUPLED LARGE AREA AMPLIFIER, the entire disclosures of each of which are hereby incorporated by reference as if being set forth in their respective entireties herein.

GOVERNMENT RIGHTS

This invention was made with Government support under Contract No. MDA-972-03-C-0043 awarded by DARPA. The Government has certain rights in this invention.

FIELD OF INVENTION

The present invention relates generally to diode laser sources, and particularly to high power, diode laser sources.

BACKGROUND OF THE INVENTION

High power, continuous wave optical signal sources are known to be desirable. It is also known to be desirable to provide high power, continuous wave optical signal sources that exhibit high power to weight ratios and manageable thermal loads. Possible uses for such sources include solid state laser (SSL) weaponry.

SUMMARY OF INVENTION

A high power laser system including: a plurality of emitters each including a large area waveguide and a plurality of quantum well regions optically coupled to the large area waveguide, wherein each of the quantum well regions exhibits a low modal overlap with the large area waveguide; a collimator optically coupled to the emitters; a diffraction grating optically coupled through the collimator to the emitters; and, an output coupler optically coupled through the diffraction grating to the emitters.

A "large area waveguide", as used herein, generally refers to a waveguide of large modal width in the transverse direction. According to an aspect of the present invention, the quantum well regions may take the form of at least one, at least partially perforated single quantum well layer. For example, where a single quantum well layer is used, it may be perforated to permit electrical contact to the side of the quantum well opposite to the top of an epitaxially grown wafer.

BRIEF DESCRIPTION OF THE FIGURES

Understanding of the present invention will be facilitated by consideration of the following detailed description of the preferred embodiments taken in conjunction with the accompanying drawings, wherein like numerals refer to like parts and.

DETAILED DESCRIPTION OF THE PREFERRED EMBODIMENTS

It is to be understood that the figures and descriptions of the present invention have been simplified to illustrate elements that are relevant for a clear understanding of the present invention, while eliminating, for purposes of clarity, many other elements found in typical optical systems and methods of making and using the same. Those of ordinary skill in the art will recognize that other elements are desirable and/or required in order to implement the present invention. However, because such elements are well known in the art, and because they do not facilitate a better understanding of the present invention, a discussion of such elements is not provided herein.

Figure 1:
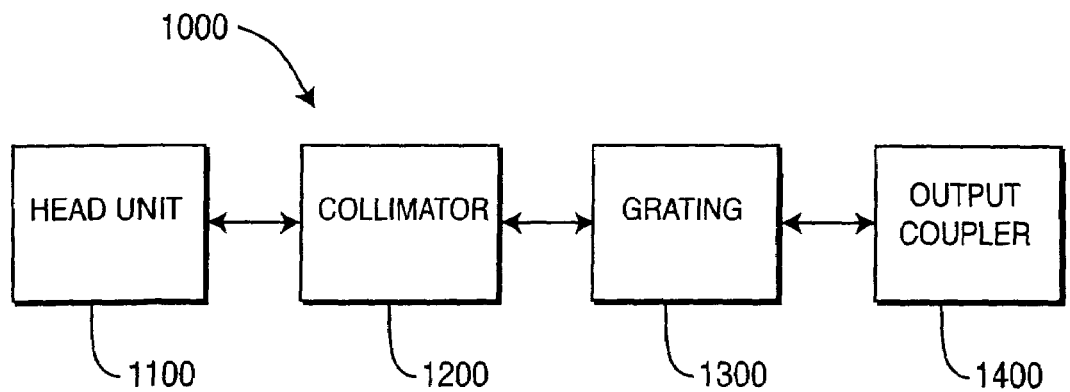
FIG. 1 illustrates a diagrammatic view of a system according to an aspect of the present invention.

Referring now to FIG. 1, there is shown a block diagrammatic view of a system 1000 according to an aspect of the present invention. Generally, system 1000 includes a head unit (CAH) 1100, collimator 1200, grating 1300 and output coupler 1400. Additional optics for beam shaping and/or other conventional effects associated with high power laser systems may be incorporated.

Generally, CAH 1100 generates and amplifies optical emissions. Collimator 1200 aligns CAH 1100 emissions at the diffraction grating 1300. Grating 1300 angularly combines spatially separated components of the CAH 1100 emissions into a single, uniform propagation direction upon the output coupler 1400. And, output coupler 1400 provides optical cavity feedback and system output.

System 1000 may be well suited for being incorporated into a compact, highly efficient Architecture for Diode High Energy Laser System (ADHELS) using direct spectral beam-combining of individual element outputs. For example, a 1040 nm Coherent High Element Power (CHEP) ADHELS according to an aspect of the present invention may include many continuous wave (cw) emitting VErtical Cavity Large Area Emitter (VECLAE) modules (CVMs) to provide high, single-spatial mode powers (such as around 1000 W per CVM), at an efficiency ($\eta_D$) of around 50% or more. As will be understood by those possessing an ordinary skill in the pertinent arts, using VECLAE based emitters allows for a substantial reduction in the number of individual beams to be combined. Accordingly, a single high power density, multi-layer dielectric grating 1300 and output coupler 1400 may provide the necessary feedback to combine 100 or more beamlets. The relative simplicity of such an optical system facilitates a high beam combining efficiency ($\eta_{BC}$) of around 70% or more, and a beam propagation factor (BPF) around 96% or more. Consistently, a laser performance metric (LPM) of such a system is estimated at around 33% or more.

Figure 2A:
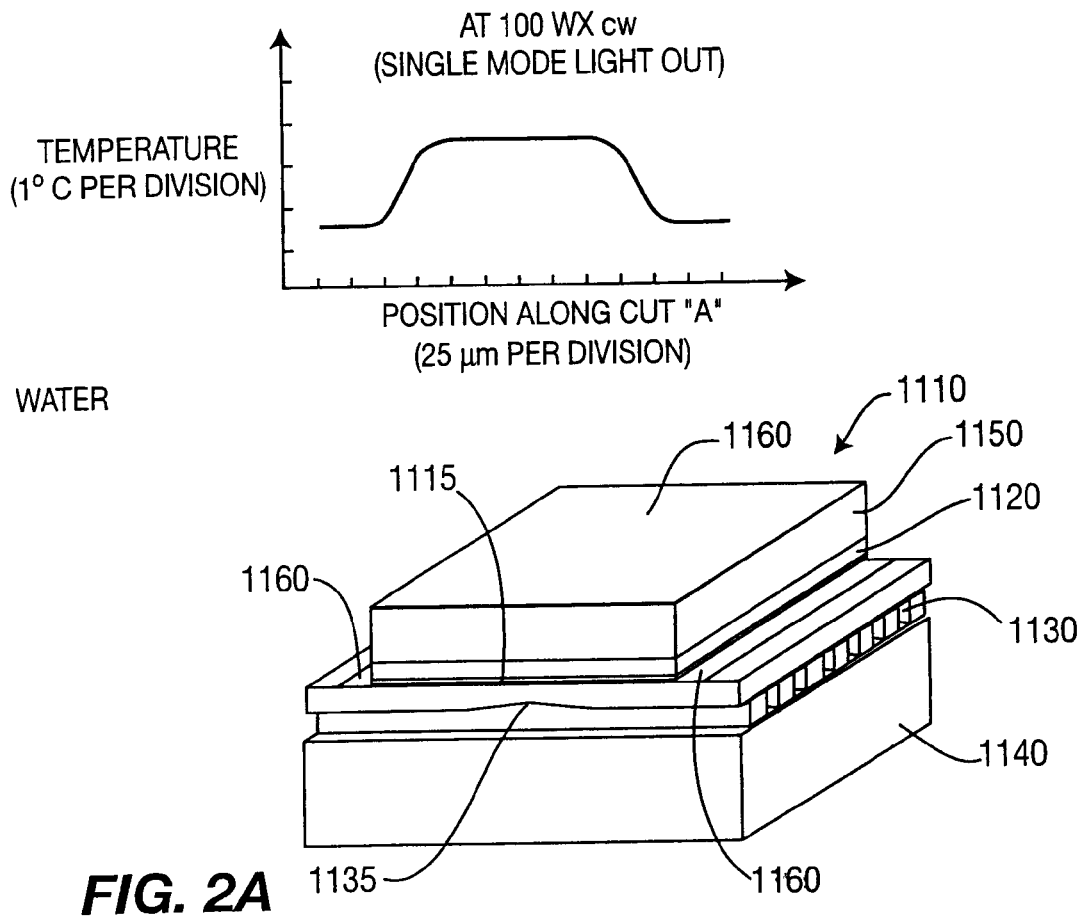
FIG. 2A illustrates a perspective view of a head unit suitable for use with the system of FIG. 1.
Figure 2B:
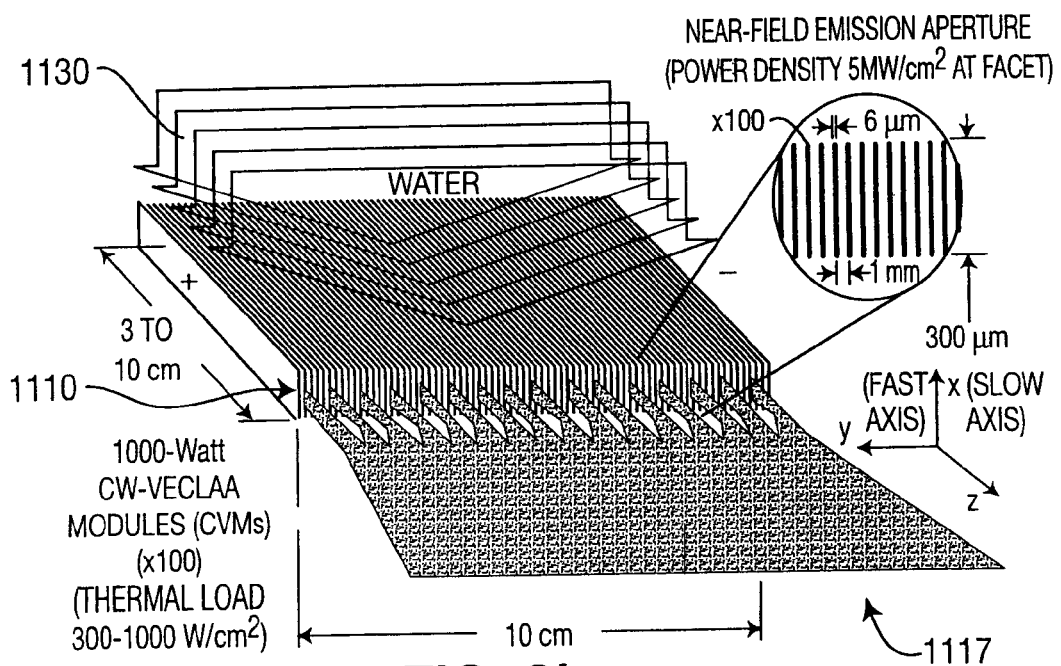
FIG. 2B illustrates an operational view of a head unit suitable for use with the system of FIG. 1.

Referring now to FIGS. 2A and 2B, each CHEP-ADHELS Head unit (CAH) 1100 includes an array of cw-VECLAE Modules (CVMs) 1110. Each CVM 1110 includes an array of VECLAE ridges 1115, a large area waveguide layer 1120, a cooler 1130, a cooler base or substrate 1140 and a VECLAE emitter substrate 1150. A heat spreader may be interposed between the VECLAE ridges and the cooler. The heat spreader may take the form of a conventional diamond based thermally transmissive structure. Solder used to couple the heat spreader to the semiconductor device may be as thin as possible, and take the form of an Indium based solder, for example.

By way of non-limiting example, each CVM 1110 may emit around 100 to around 1000 watts, or more, in a single fundamental spatial mode 1117 via waveguide layer 1120, responsively to activation of the ridges 1115. Each CVM 1110 uses an undoped, low-loss ($\alpha \sim 0.1$ cm−1), thick (t~4 to 10 μm) broad area waveguide layer 1120 having a low overlap ($\Gamma \sim 0.1\%$) to a corresponding quantum-well gain region. The quantum-well gain region may take the form of a single-quantum well gain layer. The Multiple ridges may be defined to provide p- and n-contacts (e.g., 1160) on an epitaxial side of the CVM.

Cooler 1130 provides for a substantially uniform temperature across the CVM VECLAE ridge 1115 array, resulting in a substantially uniform refractive index there-across. As is discussed in more detail below, a micro-channel cooler may be particularly well suited for use, although other coolers may be used.

Referring still to FIGS. 1, 2A and 2B, emissions from each of the arrayed CVMs 1110 in CAH 1100 may be combined incoherently and passively in free-space through simultaneous multi-wavelength locking optics (e.g., collimator 1200 and a cooled Si diffraction grating 1300) and exhibit ~95% efficiency. Reduced carrier-effect nonlinearities enable each VECLAE ridge, and hence CVM and CAH, to avoid filamentation instabilities and to support broad, high-power single-modes in either pulsed or cw operation. Ultra-low propagation losses (such as less than around 0.1 cm$^{-1}$) enable VECLAE ridge lengths to around 10 cm or more, and manageable thermal loads of around 300 to 1000 W/cm$^2$, while emitting around 1000 W. Micro-channel coolers may be used to remove more than 1000 W/cm$^2$ of heat with a realized temperature rise of less than about 3° C., while maintaining a substantially uniform temperature across a CVM 1110.

Referring still to FIGS. 1, 2A and 2B, the CVM 1110 VECLAE ridges 1115 may be arrayed on the order of 1-mm on center, and extend around 3-10 cm in length and 6 μm in width. Each CVM may be suitable for emitting around 1000 KW into an approximately 6 μm×3 mm single spatial mode at a wavelength of around 1015 nm to 1065 nm (determined by external grating 1300), while rejecting around 1000 W/cm$^2$ heat, or less, to cooler 1130. Consistently, 100 CVMs may be included in a CAH 1100 to provide a power on the order of around 100 kW. Such a combination of system simplicity and high efficiency may be particularly well suited for use in a compact, lightweight weapon system—as device high efficiency reduces both power demand and heat rejection loads that may otherwise dominate weight allocations in a solid-state laser (SSL) weapon. For example, such a 100 kW CHEP-ADHELS weapon system may have a mass ~225 kg, providing a specific weight near 2 kg/kW—a substantial improvement over other advanced SSL weapon concepts.

Figure 3:
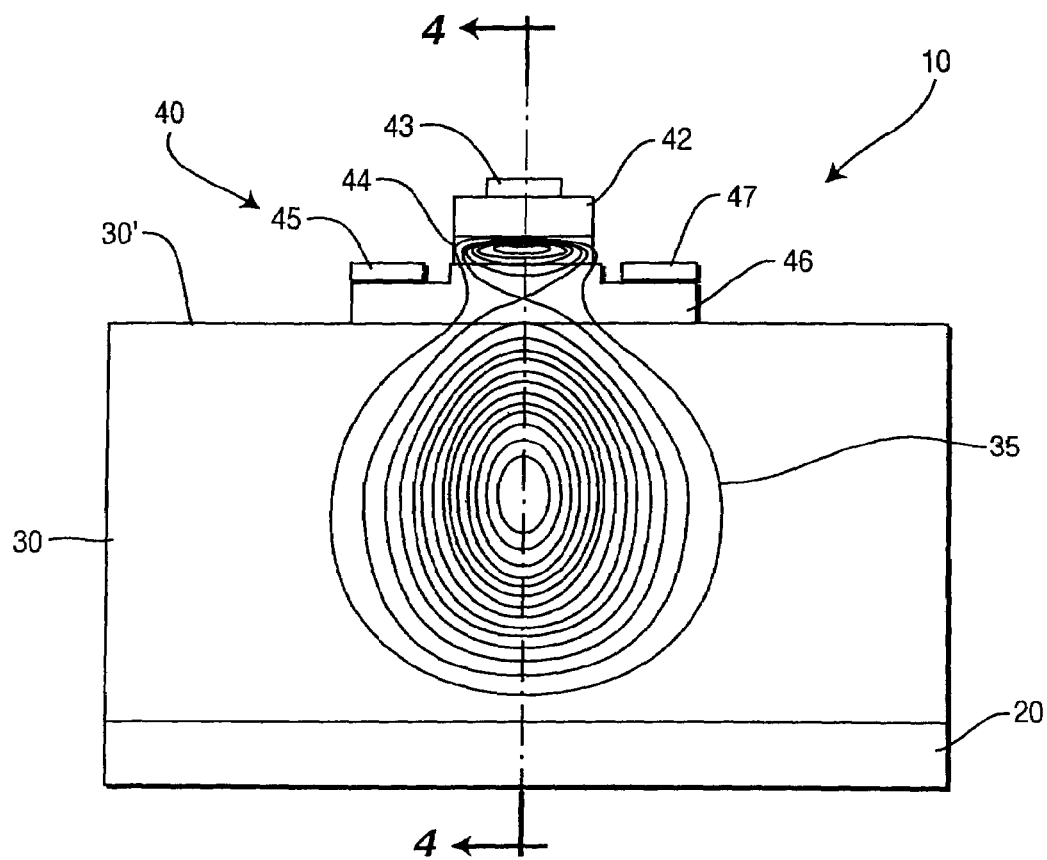
FIG. 3 illustrates a cross-sectional view of a single ridge VECLAE system according to an aspect of the present invention.

Referring now also to FIG. 3, there is shown a diagrammatic representation of a single-VECLAE ridge laser system 10 according to an aspect of the present invention. System 10 generally includes a substrate 20, guiding region 30 and ridge region 40. Substrate 20 and waveguiding region 30 may be shared with other like VECLAE ridge regions to form a VECLAE ridge array in a CVM. For example, 200 VECLAE ridge systems analogous to that shown in FIG. 3 may be incorporated using a single substrate 20 and guiding region 30 to provide a CVM 1110 VECLAE ridge array 1115 (FIGS. 2A and 2B). Thus, ridge region 40, along with other like VECLAE ridge systems, may be optically coupled to other photonic components, such as collimator 1200 (FIG. 1), in free-space, but monolithically integrated with other like VECLAE ridge systems.

Referring still to FIG. 3, substrate 20 may take the form of a conventional optical system substrate suitable for use with other materials found in the system. Substrate 20 provides a structural base upon which the regions 30, 40 may be supported. Substrate 20 may be composed of GaAs, by way of non-limiting example only.

Region 30 serves as a primary propagation and amplification region during operation. Region 30 may be composed of one or more waveguiding materials suitable for use with other materials found in the system. For example, region 30 may be composed of AlGaAs. According to an aspect of the present invention, region 30 may be undoped. According to an aspect of the present invention, region 30 may be composed of undoped AlGaAs. According to an aspect of the present invention, the cross-sectional area of region 30 may be large compared to the active layer of region 40. Region 30 is vertically, optically coupled to region 40, such that activation of region 40 serves to generate and amplify optical signals in region 30.

Region 40 may take the form of a ridge waveguide structure including an active layer sandwiched between cladding layers. For example, region 40 may include quantum well(s) in a layer 44 sandwiched between an upper cladding 42 and a lower cladding 46. By way of further example, quantum well(s) layer 44 may take the form of a single quantum well (SQW) structure or multi-quantum well (MQW) structure. Quantum well(s) layer 44 may be composed of any suitable material system, such as an InGaAs/GaAs material system, by way of non-limiting example only. Upper cladding 42 may take the form of a suitable cladding material for use with layer 44, such as p-AlGaAs. Lower cladding 46 may also take the form of a suitable cladding material for use with layer 44, such as n-AlGaAs. Contact 43 may be provided for upper cladding layer 42. Contacts 45 and 47 may be provided for lower cladding layer 46. In one configuration, contact 43 provides a p-contact for region 40, while contacts 45, 47 provide n-contacts for region 40, as will be understood by those possessing an ordinary skill in the pertinent arts.

The ridge waveguide structure may optionally be provided with passivation and/or cap layers. Further, lower cladding layer 46 of the ridge waveguiding structure may be coupled to an upper surface 30' of region 30—thereby vertically, optically coupling region 30 to region 40.

Again, while FIG. 3 illustrates a single-ridge VECLAE ridge laser system for non-limiting purposes of explanation, many ridges (forming many regions 40) may be combined on a single substrate 20 and region 30 to provide for a multi-ridge VECLAE laser ridge array suitable for use in CVM 1110 of FIGS. 2A and 2B. For example, many ridges, such as up to 200 or more, may be simultaneously formed from commonly processed layers over region 30.

Figure 4:
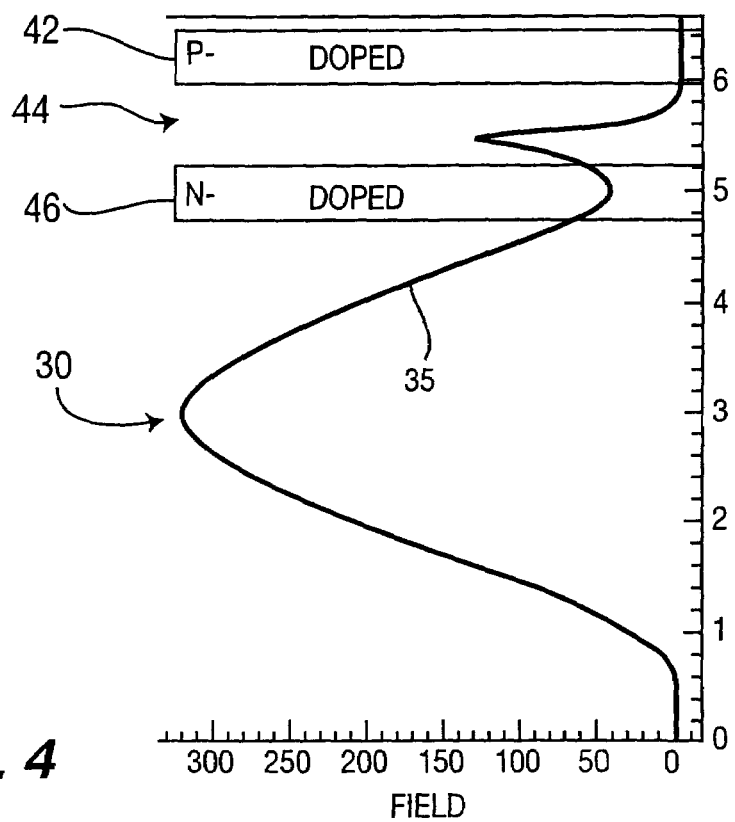
FIG. 4 illustrates a mode profile corresponding to section 4-4 of the system of FIG. 3.

Referring now also to FIG. 4, there is shown an operating mode profile 35 of the system of FIG. 3 according to an aspect of the present invention. As may be seen therein, region 30 provides large-mode waveguide functionality for ridge structure 40. As may also be seen, and according to an aspect of the present invention, a low modal overlap to doped layers (42, 46) may be provided. For example, the overlap may be about 0.1% or less. Accordingly, system 10 exhibits low optical internal loss characteristics, such as below about 0.8 $cm^{-1}$. According to an aspect of the present invention, the cladding layers (42, 46) may be highly doped, such as on the order of about $10^{18}$ $cm^{-3}$. Further, according to an aspect of the present invention, top cladding layer(s) (42) may be relatively thin, such as on the order of about 0.5 μm. As will be understood by those possessing an ordinary skill in the pertinent arts, these characteristics lead to a device exhibiting low electrical resistance, on the order of about $10^{-5}$ $\Omega \cdot cm^2$ for example, and a low temperature resistance, on the order of about 2° C./Watt·mm for example.

A device featuring these characteristics is suitable for use with high current injection. Thus, device 10 it suitable for generating high power optical signals. Further, as may be seen in FIGS. 3 and 4, according to an aspect of the present invention a large optical mode 35 is provided. Further yet, as the majority of the optical mode of system 10 propagates in undoped material, system 10 exhibits low optical loss and low heat generation—as compared to conventional diode lasers, for example.

Referring again to FIGS. 1, 2A, 2B and 3, system 10 includes a first end facet of layer 30 useful as first end of an optical lasing cavity of system 1000, and an opposite end facet of layer 30 used to pass light to and from the external optical cavity of system 10. The second end of the optical cavity may be defined by output coupler 1400. The first facet may include a conventional highly reflective (HF) coating, and the second facet may include an anti-reflective (AR) coating.

Figure 5A:
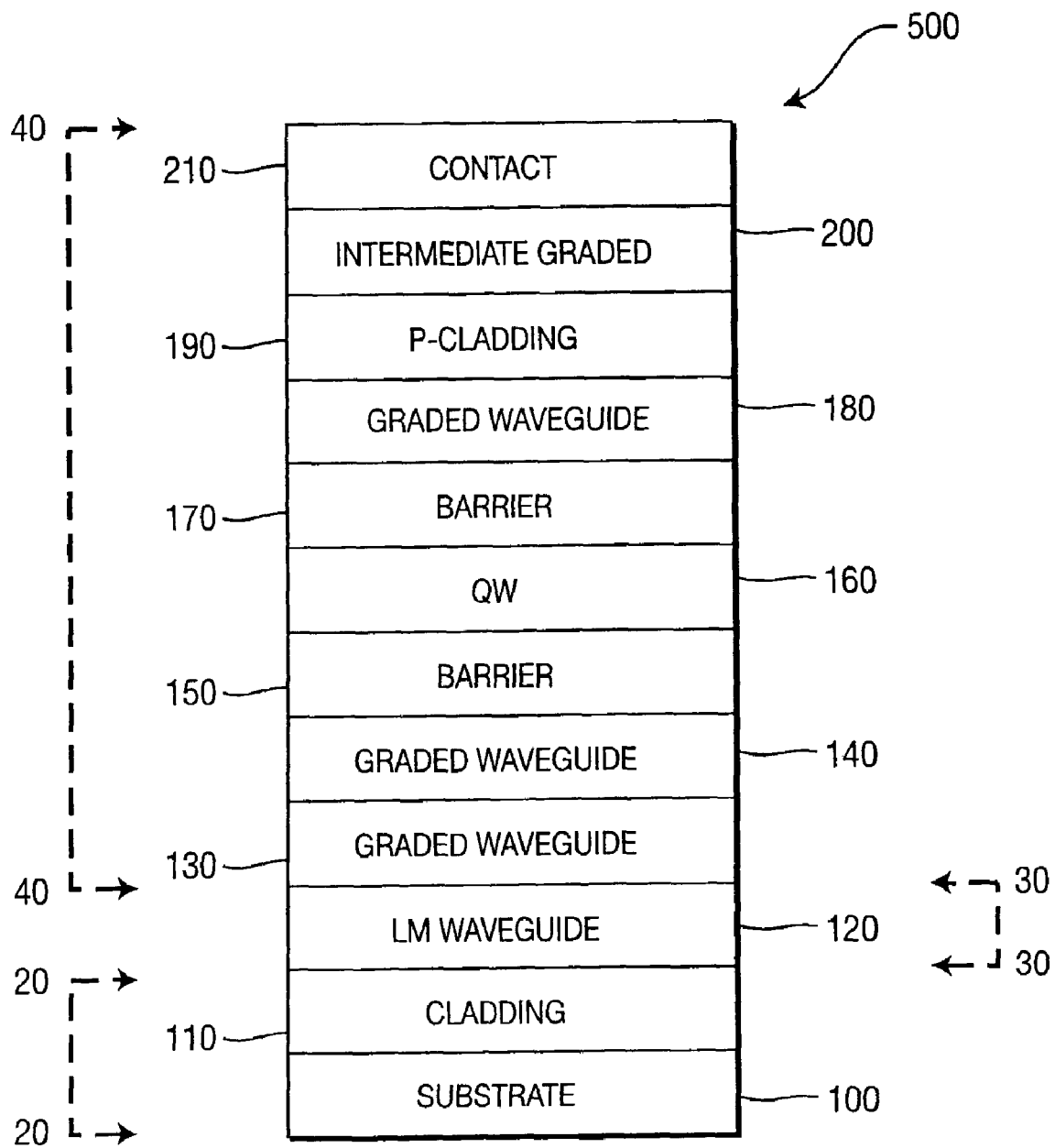
FIG. 5A illustrates a diagrammatic view of a system according to an aspect of the present invention.

For non-limiting purposes of further explanation only, the following example may be considered. Referring now to FIG. 5A, there is shown a material system 500 according to an aspect of the present invention. System 500 may include a semi-insulating substrate 100, such as a GaAs substrate. Substrate 100 may include an AlGaAs spoiler layer that discriminates between the fundamental and higher order modes in operation. Such a spoiler layer may have an Al moles fraction similar to that of the waveguide layer itself, but less than the lower cladding. For example, such a spoiler layer may have an Al content around 0.25%, be about 2.6 μm thick and un-doped. A lower cladding layer 110 may be provided upon substrate 100 over the spoiler layer. Lower cladding 110 may be about 1 μm thick and be undoped. Lower cladding 110 may be composed of AlGaAs, and have an Al content of about 0.255%. A large-mode waveguide layer 120 may be formed over lower cladding 110. Large-mode waveguide layer 120 may be composed of AlGaAs, and have an Al content of about 0.245%. Large-mode waveguide layer 120 may be about 3 μm thick and also be undoped. A graded waveguide layer 130 may be provided over large-mode waveguide 120. Graded waveguide layer 130 may have an aluminum content that is graded from about 0.31% to about 0.25%. The graded layer 130 may be graded substantially linearly and transversely with respect to the layers structure, with the lower Al percentage nearer the quantum well(s) layer. Graded waveguide layer 130 may be about 0.3 μm thick. Graded layer 130 may be n-doped to around less than about $3 \times 10^{18}$ $cm^{-3}$. For example, layer 130 may be doped to about $1 \times 10^{18}$ $cm^{-3}$. Graded waveguide 130 may be provided with an n-contact layer, composed of AlGaAs, for example. The n-contact AlGaAs may have an Al content of about 20% to about 30%, and a doping level on the order of about $1 \times 10^{18}$ $cm^{-3}$. The n-contact may have an electron mobility of at least about 1000 V/cm sec.

A graded waveguide layer 140 may be provided over layer 130. Layer 140 may be about 0.3 μm thick. Graded waveguide layer 140 may have an aluminum content that is graded from about 0.25% to about 0.21%. The graded layer 140 may be graded substantially linearly and transversely with respect to the layers structure, with the lower percentage nearer the quantum well(s) layer. Graded waveguide layer 140 may be undoped. A GaAs barrier layer 150 may be provided over graded layer 140. Barrier layer 150 may be about 10 nm thick, for example. Barrier layer 150 may be undoped. An InGaAs quantum well layer 160 may be provided over barrier layer 150. The content and configuration of the quantum well layer may be selected to provide gain at a wavelength of interest. By way of non-limiting example, layer 160 may have an In content of about 0.2, and be about 7 nm thick, for example. Layer 160 may also be undoped. A GaAs barrier layer 170 may be provided over quantum well layer 160. Barrier layer 170 may be about 10 nm thick and be undoped as well. A graded waveguide layer 180 may be provided over barrier layer 170. Layer 180 may be about 0.6 μm thick. Layer 180 may be composed of AlGaAs, and have an Al content that is graded from about 0.2% to about 0.4%. The graded layer 180 may be graded substantially linearly and transversely with respect to the layers structure, with the lower percentage nearer the quantum well(s) layer. Layer 180 may be undoped. A p-cladding layer 190 may be provided over layer 180. Layer 190 may be about 1 μm thick. Layer 190 may be composed of AlGaAs, and have an Al content of about 0.4%. Layer 190 may be p-doped to about $2 \times 10^{18}$ $cm^{-3}$. An intermediate graded layer 200 may be provided over layer 190. Layer 200 may be about 350 nm thick. It may be composed of AlGaAs, and have an Al content that is graded from about 0.4% to about 0%. Layer 200 may be graded substantially linearly and transversely with respect to the layers structure. The graded layer may have the lower Al content nearer the quantum wells layer. Layer 200 may be p-doped to about $2 \times 10^{18}$ $cm^{-3}$. Finally, a contact layer 210 may be provided over layer 200. Layer 210 may be about 50 nm thick. Layer 210 may be composed of GaAs and be p-doped to about $1.5 \times 10^{19}$ $cm^{-3}$.

For non-limiting purposes of further explanation only, the following example may also be considered. Referring again FIG. 5A, there is shown a material system 500 according to an aspect of the present invention. System 500 may include a semi-insulating substrate 100, such as a GaAs substrate. Substrate 100 may include an AlGaAs spoiler layer. Such a spoiler layer may have an Al content around 0.252%, be about 5 μm thick and un-doped. A lower cladding layer 110 may be provided upon substrate 100 over the spoiler layer. Lower cladding 110 may be about 1.5 μm thick and be undoped. Lower cladding 110 may be composed of AlGaAs, and have an Al content of about 0.255%. A large-mode waveguide layer 120 may be formed over lower cladding 110. Large-mode waveguide layer 120 may be composed of AlGaAs, and have an Al content of about 0.250%. Large-mode waveguide 120 may be about 6 μm thick and also be undoped. A graded waveguide layer 130 may be provided over large-mode waveguide 120. Graded waveguide layer 130 may have an aluminum content that is graded from about 0.31% to about 0.25%. The graded layer 130 may be graded substantially linearly and transversely with respect to the layers structure, with the lower Al percentage nearer the quantum well(s) layer. Graded waveguide layer 130 may be about 0.3 μm thick. Graded layer 130 may be n-doped to around less than about $3\times10^{18}$ cm$^{-3}$. For example, layer 130 may be doped to about $1\times10^{18}$ cm$^{-3}$. Graded waveguide 130 may be provided with an n-contact layer, composed of AlGaAs, for example. The n-contact AlGaAs may have an Al content of about 20% to about 30%, and a doping level on the order of about $1\times10^{18}$ cm$^{-3}$. The n-contact may have an electron mobility of at least about 1000 V/cm sec.

A graded waveguide layer 140 may be provided over layer 130. Layer 140 may be about 0.3 μm thick. Graded waveguide layer 140 may have an aluminum content that is graded from about 0.25% to about 0.21%. The graded layer 140 may be graded substantially linearly and transversely with respect to the layers structure, with the lower percentage nearer the quantum well(s) layer. Graded waveguide layer 140 may be undoped. A GaAs barrier layer 150 may be provided over graded layer 140. Barrier layer 150 may be about 10 nm thick, for example. Barrier layer 150 may be undoped. An InGaAs quantum well layer 160 may be provided over barrier layer 150. Layer 160 may have an In content of about 0.2, and be about 7 nm thick, for example. Layer 160 may also be undoped. A GaAs barrier layer 170 may be provided over quantum well layer 160. Barrier layer 170 may be about 10 nm thick and be undoped as well. A graded waveguide layer 180 may be provided over barrier layer 170. Layer 180 may be about 0.6 μm thick. Layer 180 may be composed of AlGaAs, and have an Al content that is graded from about 0.2% to about 0.4%. The graded layer 180 may be graded substantially linearly and transversely with respect to the layers structure, with the lower percentage nearer the quantum well(s) layer. Layer 180 may be undoped. A p-cladding layer 190 may be provided over layer 180. Layer 190 may be about 1 μm thick. Layer 190 may be composed of AlGaAs, and have an Al content of about 0.4%. Layer 190 may be p-doped to about $2\times10^{18}$ cm$^{-3}$. An intermediate graded layer 200 may be provided over layer 190. Layer 200 may be about 350 nm thick. It may be composed of AlGaAs, and have an Al content that is graded from about 0.4% to about 0%. Layer 200 may be graded substantially linearly and transversely with respect to the layers structure with the lower Al content nearer the quantum wells layer. Layer 200 may be p-doped to about $2\times10^{18}$ cm$^{-3}$. Finally, a contact layer 210 may be provided over layer 200. Layer 210 may be about 50 nm thick. Layer 210 may be composed of GaAs and be p-doped to about $1.5\times10^{19}$ cm$^{-3}$.

This latter material system may yield beam narrowing to a full width at half maximum (FWHM) value of around 5° to 6°. In summary, the differences: increase the large mode waveguide thickness from about 3 μm to about 6 μm; increase Al contents in the large mode waveguide; increase the lower clad thickness to about 1.5 μm; increase spoiler thickness to about 5 μm; and, increase Al contents in spoiler layer to around 25.1-25.2%

Regardless of the particulars, layers 100-210 may be provided and shaped using conventional processing methodologies suitable for use with the materials thereof, such as deposition and etching for example. Conventional processing technologies may be used to simultaneously form many VECLAE ridges over a common substrate and large area waveguide layer, for example. According to an aspect of the present invention, one may precisely control the Al content of layer 120 to provide for good waveguiding and amplification properties. For example, it may prove important to control the Al content to within about 1% of the target content. Layers 100, 110 are suitable for use as substrate 20 of FIG. 1. Layer 120 is suitable for use as region 30 of FIG. 1, and layers 130-210 are suitable for use as region 40 of FIG. 1.

By way of further, non-limiting example only, it is expected that the second-discussed material layer structure will provide a FA FWHM of ~6° with an Al content x=0.252 in the spoiler, 5° with x=0.251 and 6.5° with x=0.254. As will be understood by those possessing an ordinary skill in the pertinent arts, device performance may sharply depend on the composition of the spoiler layer. It is believed that the broadening FA FWHM with an increase of Al contents is due to the reduction of zero mode penetration in the spoiler layer. The decrease of Al content in the spoiler layer leads to fast increase of the zero mode leakage out of the waveguide. This leakage is equivalent to the losses of 1 cm$^{-1}$ if Al content drops to 25.0% and yet negligible at x=0.251. The increase of Al content in the spoiler layer decreases the difference in the optical ("selection") losses between zero and second transverse modes. These difference are 8 cm$^{-1}$ and 5 cm$^{-1}$ for x=0.251 and 0.252, respectively. At x=0.254 difference in the losses and mode selection disappear.

Accordingly, beam width of a VECLAE ridge and array of ridges may vary as a function of growth technology. The accuracy of flow control preferably allows for growth of an $Al_{0.25}Ga_{0.75}As$ spoiler layer with a tolerance of about +/−0.1 Al or better. In such a case, yield of VECLAE structures providing a FA FWHM between 5° and 6° and high-mode discrimination factor at a level better than about 5 cm$^{-1}$ is expected to be about 50%.

Figure 5B:
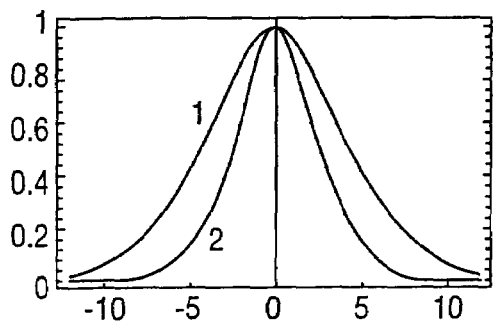
FIGS. 5B-5E illustrate exemplary performance characteristics according to an aspect of the present invention.
Figure 5C:
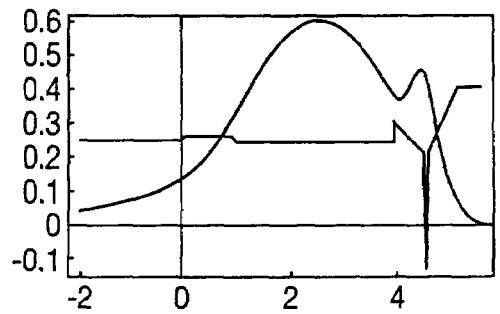
Figure 5D:
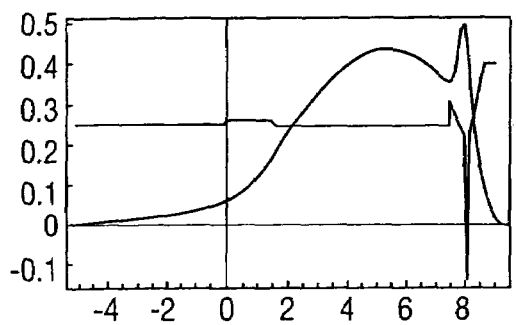
Figure 5E:
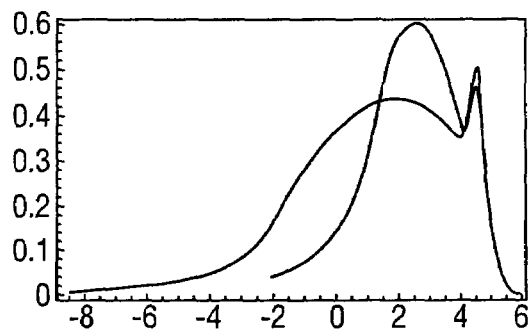

Far fields of a VECLAE structure according to the first example discussed in connection with FIG. 5A (curve 1) and the second example discussed in connection with FIG. 5A (curve 2) are shown in the FIG. 5B. Zero mode near field distribution for VECLAE structures according to the first and second examples discussed in connection with FIG. 5A are respectively shown in FIGS. 5C and 5D, along with Al composition distributions in these structures. In FIGS. 5C and 5D, distance is in microns, and zero on the distance axis marks the position of interface between the spoiler and low waveguide layers. In FIG. 5E the near field distributions of FIG. 5C and 5D are compared, assuming that the positions of QWs coincide. In FIG. 5E, the curves are normalized to the same intensity.

Figure 6:
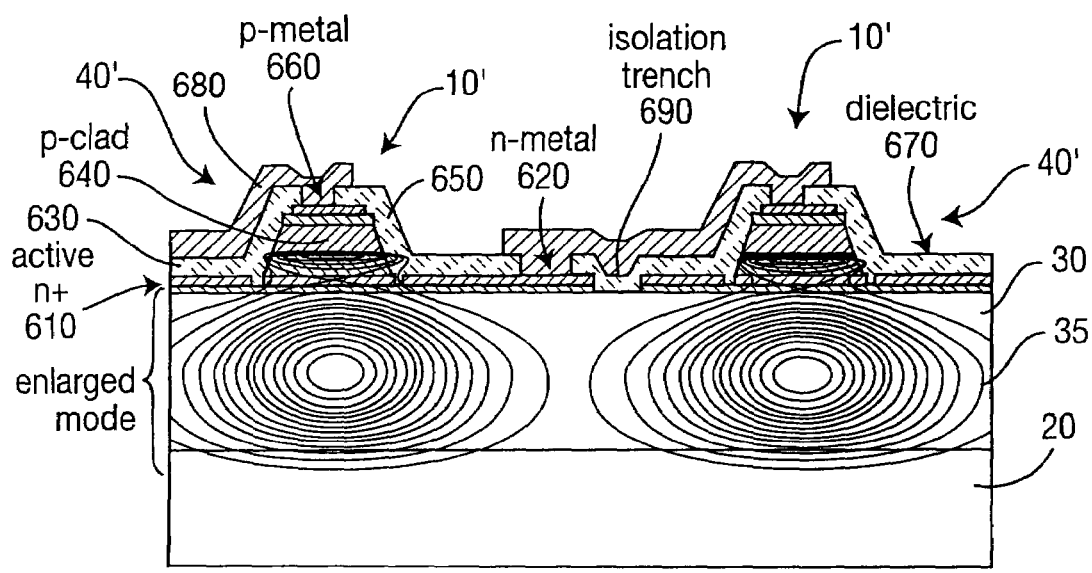
FIG. 6 illustrates a cross-sectional view of a multi-ridge VECLAE system according to an aspect of the present invention.

As set forth, multiple VECLAE ridges may be monolithically integrated together. Referring now also to FIG. 6, there are shown two integrally formed VECLAE ridge systems 10'. Like system 10, each system 10' is formed on a common substrate 20, and uses a common guiding region 30, but separate ridge region 40'. In the illustrated case, an n+ cladding layer 610 is provided over common broad area waveguiding regions 30 and substrate 20. An n-type metallization, contact layer 620 is provided over layer 610. An active region 630, such as one including a single quantum-well, may be provided over n+ cladding layer 610. A p− cladding layer 640 may be provided over active layer 630. A conventional p-contact layer 650 may be provided over layer 640. A conventional p− metal layer 660 may be provided over layer 650. A dielectric layer 670 may be provided over layers 660, 650, 620. Dielectric layer 670 may take the form of silicon nitride, for example. Finally, an interconnect metal layer 680 may be selectively provided over p-contact layer 660 and dielectric 670.

Layers 620, 630, 640, 650 and 660 may be selectively patterned to define a plurality of VECLAE ridge regions or structures 10'. Layer 610 may be selectively patterned, such as by etching trenches 690 (one is shown), to provide VECLAE ridge 10' electrical isolation. Individual mode profiles 35' may result from activation of active regions 630—which mode profiles may collectively define a device supermode profile.

In practice, several hundred VECLAE ridge systems 10' may be integrally formed as emitters in a CVM. For example, 100 or 200 VECLAE ridges may be integrally formed on substrate 20 and use common guiding region 30. The outermost (i.e., peripheral) ridges may be laterally separated by around 10 cm or more, for example.

Referring again to FIG. 1, in such a configuration, optical cavity length may be around 170 cm. The collimator 1200 may use any suitable number of elements, such as five spherical lens elements, to collimate the 100 or more extended beamlets onto diffraction grating 1300. Emerging from grating 1300 at near-Littrow condition is a single, multi-wavelength beam, which propagates to output coupler 1400. Anamorphic optics may be used to circularize and adjust $1/e^2$ beam diameter to an about 67% exit aperture diameter. Diffractive, refractive, and reflected optical losses may yield $\eta_{BC} > 70\%$. The narrow VECLAE far-field in the fast axis, around 5°-10° FWHM, mitigates a need for a lenticular array, dramatically simplifying optical design and mitigates against three-dimensional misalignment that may otherwise prove inevitable with In-mounted high-power laser chips of ±10 μm. Thus, according to an aspect of the present invention, each CVM is automatically self-wavelength-locked to spectral passbands collimating all beams together.

As will be understood by those possessing an ordinary skill in the pertinent arts, conventional single-mode diode lasers with output power ~1 W are impractical for spectral-beam-combined scaling to 100 kW due to the large number of sources, which would in turn require a less-efficient scheme of phase-locking. The present invention addresses this shortcoming by using VECLAE sources, which have a transverse mode greater than about 4 μm, thereby enabling output power ranging from about 100 to 1000 W, while maintaining manageable heat fluxes of ~1000 W/cm². According to an aspect of the present invention, separate QW and waveguide regions enable the VECLAE to support greatly enlarged modal cross-sections in both transverse and lateral directions, with single fundamental lateral supermode operation. Further, the undoped planar waveguide beneath top p- and n-contacts permits modal propagation loss of an intrinsic semiconductor, i.e., $\alpha_{VECLAE} \leq 0.1$ cm$^{-1}$ for >1 cm length. Further yet, the "dilute waveguide" has a QW modal overlap of $\Gamma_{QW}$ less than about 0.1%, thereby sharply reducing carrier-effect nonlinearity as compared to conventional structures of ~1.5% overlap. This is demonstrated in the following Table—1, which illustrates non-limiting, exemplary parameters according to an aspect of the present invention.

TABLE 1

| # ribs | $N_{ribs}$ | 10 |
|---|---|---|
| rib width | $w_{rib}$ | 10 μm |
| Current | $I_{bias}$ | 100 Amps |
| gap width | $w_{gap}$ | 6 μm |
| index step | $\Delta n$ | $5 \times 10^{-4}$ |
| Confinement | $\Gamma_{QW}$ | 0.1% |

TABLE 1-continued

| Loss | $\alpha_{VECLAE}$ | 0.1 cm$^{-1}$ |
|---|---|---|
| linewidth enhancement factor | $\alpha_N$ | 2 |
| differential gain | $a_N$ | $1.2 \times 10^{-15}$ cm$^2$ |
| transparency carrier density | $N_{tr}$ | $1.8 \times 10^{18}$ cm$^{-3}$ |
| non-radiative recombination rate | A | 0.1 ns$^{-1}$ |
| spontaneous recombination rate | B | $10^{-10}$ cm$^3$ s$^{-1}$ |
| Wavelength | $\lambda$ | 1040 nm |
| voltage defect (source of apparent series resistance caused by heterojunctions within laser) | $V_d$ | 0.25 V (~10 kT) |
| specific contact resistivity | $\rho_s$ | $10^{-5}$ Ω-cm$^2$ |
| refractive index temp coefficient | $\partial n/\partial T$ | $3 \times 10^{-4}$ °C.$^{-1}$ |
| QW gain-temperature coefficient | $(\partial g/\partial T)/g$ | $2.7 \times 10^{-3}$ °C.$^{-1}$ |

By way of further explanation, conventional single-mode ridge lasers typically employ ~3 μm waveguides, because wider ribs cause multimode "filamentation" even under short-pulse bias, due to refractive index dependence on power mediated by well-known carrier-effect nonlinearities. A "dilute" waveguide (one with small $\Gamma_{QW}$) suppresses refractive index changes causing filamentation, thus permitting the VECLAE real-refractive-index guiding to control light propagation. For cw operation, the small $\alpha_{VECLAE}$ sharply reduces thermal-effect nonlinearities mediated by absorption and bandgap-shrinkage-mediated index change.

Figure 7:
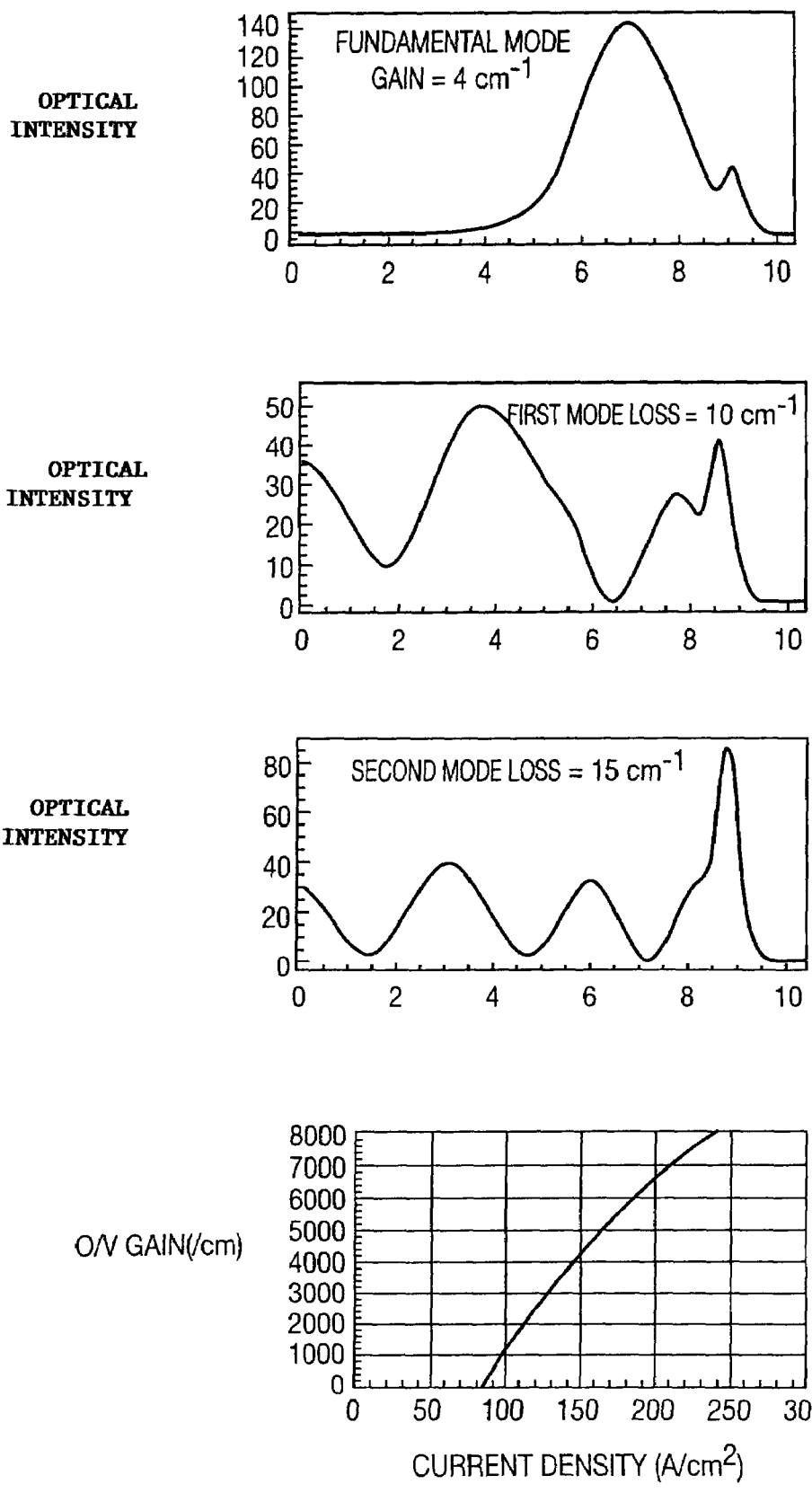
FIG. 7 illustrates exemplary performance characteristics according to an aspect of the present invention.

Referring now also to FIG. 7, according to an aspect of the present invention, a transverse leaky waveguide that imparts loss to non-fundamental-order modes may result. For example, broad area lasers with ~4-μm thick planar waveguides and corresponding narrow transverse single-mode far-fields may operate according to this principle. In practice, however, the proposed VECLAE may typically include 10 to 100 (or more) coupled ribs supporting a fundamental super-mode extending over the device width.

Referring still to FIG. 7, there is shown the lowest order planar modes of a VECLAE material structure according to an aspect of the present invention. The planar VECLAE waveguide is lossy for modes other than the fundamental mode. As should be understood by those possessing an ordinary skill in the pertinent arts, this mechanism is distinct from "slab coupling".

Referring still to FIG. 7, an exemplary QW gain vs. current density relationship corresponding to broad area lasers operating in the fundamental mode with a 0.1% overlap to the QW according to the present invention is also shown. As is demonstrated thereby, uncoated 100 μm wide lasers of 2.5 mm in length may be expected to laze at around 400 mA, equivalent to approximately 5000 cm$^{-1}$ QW gain but only 4 cm$^{-1}$ modal gain.

Figure 8:
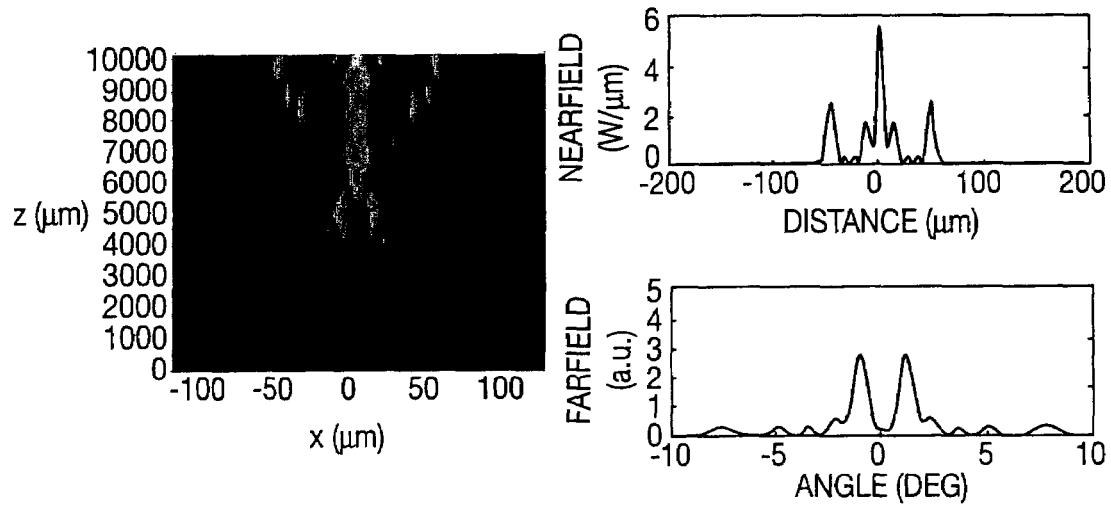
FIG. 8 illustrates performance characteristics of a broad area waveguide.
Figure 9:
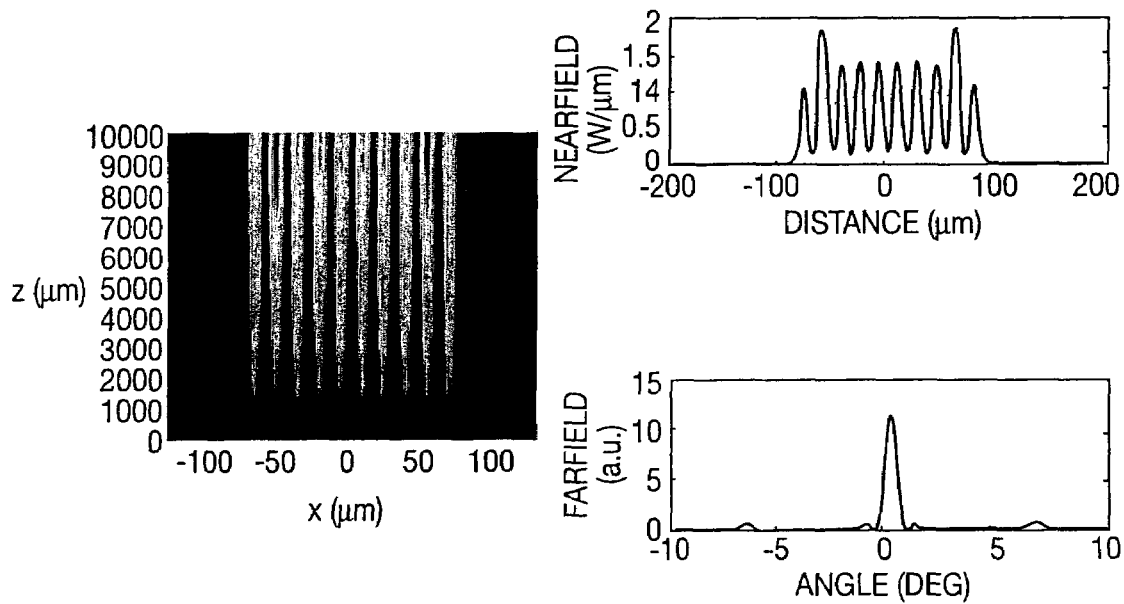
FIGS. 9-13 illustrate performance characteristics of a broad area waveguide according to an aspect of the present invention.

Referring now also to FIGS. 8 and 9, CVM performance can be modeled using the 2D beam propagation method (BPM) modified by thermal and rate equations to model the heat, gain, and refractive index response to local carrier and optical power densities. As expected, filaments are predicted in a conventional 100-μm-wide broad area amplifier (FIG. 8). However, it is predicted that in a 10 ridge (1-cm×160 μm×4 μm) including VECLAE (FIG. 9), light propagates smoothly in a stationary pattern along 10 stripes despite close coupling. Although the near-field shows considerable structure, the far-field emits ~100 W in a single lobe. By way of non-limiting further discussion only, it is believed that carrier-effect nonlinearities are able to cause only small refractive index perturbations in a VECLAE as compared to the built-in lateral refractive index profile defined by the ridge structure.

By way of further, non-limiting explanation only, FIG. 8 illustrates a non-thermal BPM simulation (relevant for pulsed operation) of a 125 W output power broad area amplifier (100 µm wide ×1 cm long). Optical power along the device (input at bottom; output at top), and output near- and far-fields (top and bottom) are shown. In the illustrated case, the input is a 10 W Gaussian profile, and power-in-the-bucket (taken between first zeroes of single slit diffraction pattern) is considered to be negligible.

In contrast, FIG. 9 illustrates non-thermal BPM simulation (relevant for pulsed operation) of a 125 W output power VECLAE (154 µm wide) with ten 10 µm stripes and nine 6 µm gaps. Therein is again shown optical power along the device (propagation in z-direction), and output near- and far-fields. In the illustrated case, input is again a 10 W Gaussian profile. However, in this case one-dimensional power-in-the-bucket is 99 Watts (79%) where the "bucket" is defined by the zeroes of the single slit diffraction pattern corresponding to the 154 µm aperture.

Figure 10:
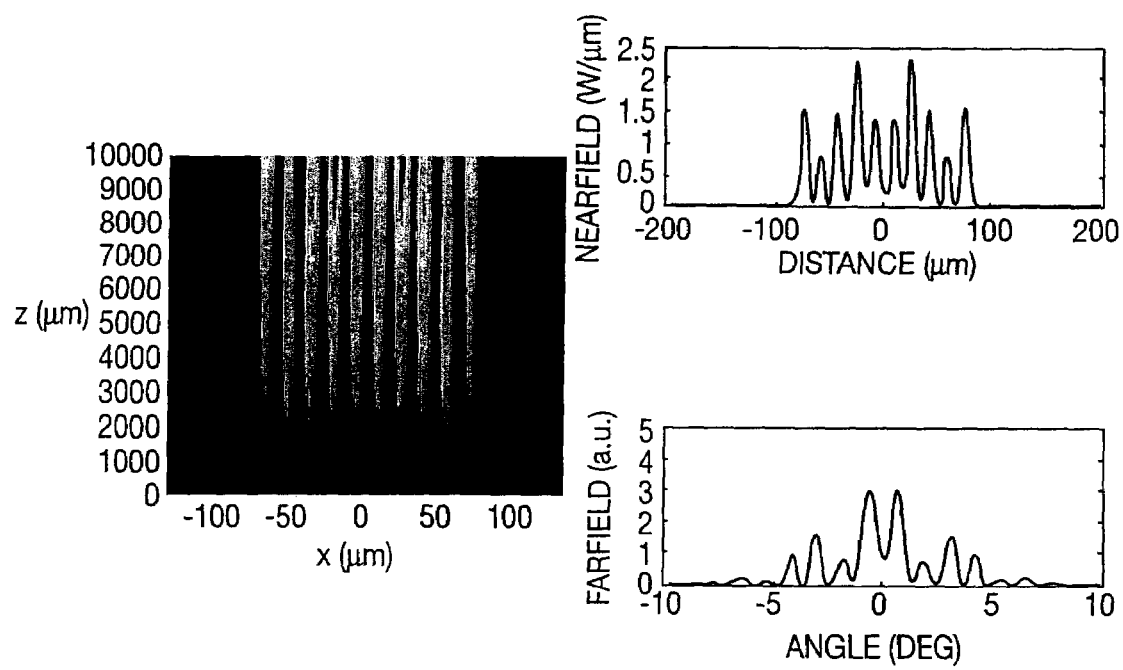
Figure 11:
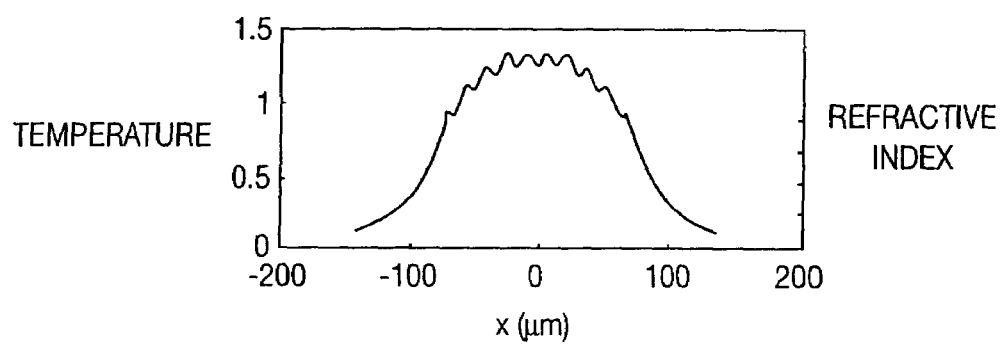

For cw operation, the following dissipative heat sources may be introduced to take thermal nonlinearity into account: non-radiative recombination; voltage drop over hetero-junction barriers (voltage defect); resistive heating; and, bulk optical absorption. One may predict heat flow in the cross-section of the device and the heat-sink with a single point heat source using finite element simulation. Extracting the temperature increase horizontally around this point provides a kernel, which may be included in the BPM solver. Using such an analysis, performance of the VECLAE in FIG. 10 appears degraded under cw operating conditions. Although light propagates along the ridges, the far-field appears distorted (FIG. 10). This may result from a differing operating temperature across the device (e.g., near a periphery as opposed to the center) causing a phase difference to accumulate between the middle and edges of the device. FIG. 10 shows a graphical representation of thermal BPM simulation (relevant for cw operation) of a uniformly heat-sunk VECLAE shown in FIG. 9 including a diamond heat sink layer. As may be seen in FIG. 10, a poor far-field pattern results from temperature differences across the ridge array. While, FIG. 11 shows a cross-sectional temperature profile near the output facet corresponding to the simulation of FIG. 10, a 0.5° C. temperature difference between stripes is believed to be responsible for the degraded performance of the uniformly heat-sunk VECLAE.

In other words, the problem affects ridges at the periphery of the VECLAE; such that for larger VECLAE arrays, such as arrays of 100 ridges or more (1 mm width), the temperature is more uniform for the vast majority of the stripes. Thus, heat stabilization across large VECLAE arrays does not appear to be critical. Nonetheless, even for a 10 element VECLAE, a flat phase front may be restored. For example, equalization of phase by preferentially pumping outer VECLAE ridges may be used. Pre-compensation of phase by slight variation of ridge widths across the ridge array may be used. Or, heat sinking, such as by using micro-channel coolers may be used. Optionally, preferentially cooling of the central waveguides may be used. Again though, heat non-uniformity is believed to become more mitigated with the larger of an array that is used (e.g., the more VECLAE ridges that are used).

The micro-channel approach may nonetheless provide additional benefits, such as facilitating operation over a wider temperature range. Referring again to FIG. 2, a sawtooth shaped Si MEMS 1135 may prove particularly well suited for use. Alternatively, heatsinks, such as those discussed in "Modular Microchannel Cooled Heatsinks for High Average Power Laser Arrays", IEEE Journal of Quantum Electronics, Vol. 28, No. 4, April 1992, or U.S. Pat. No. 5,548,605, entitled "Monolithic Microchannel Heatsink", the entire disclosures of which are hereby incorporated by reference herein, may be used.

Figure 12:
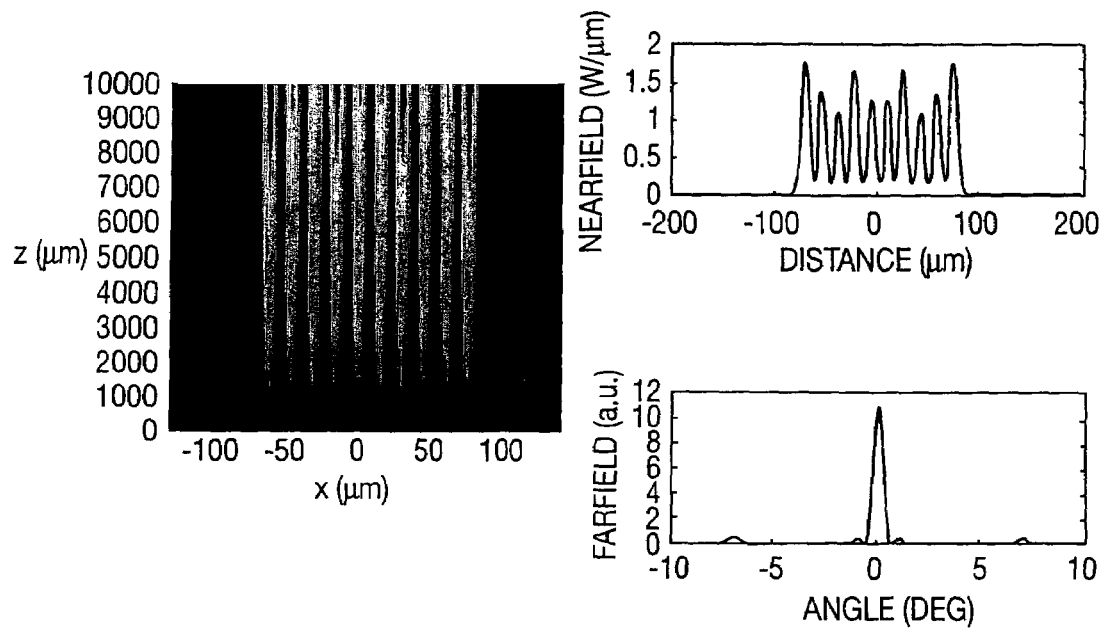
Figure 13:
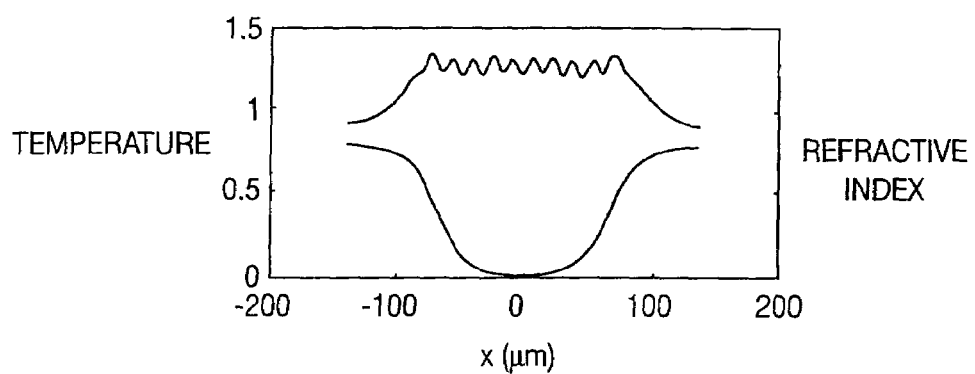

Referring now also to FIG. 12, a cw-VECLAE using such a cooling scheme may exhibit performance substantially equivalent to that obtained in pulsed operation, demonstrating effective cooling. A corresponding temperature profile and the temperature compensation profile are shown in FIG. 13. A central lobe power of ca. 100 W (78% power-in-the-bucket) is simulated when cooling is employed.

Figure 14A:
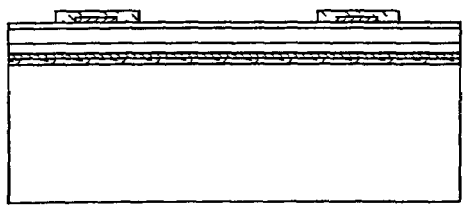
FIGS. 14A-14H illustrate a multi-ridge VECLAE device at various processing stages according to an aspect of the present invention; and, FIG. 15 illustrates operational characteristics according to an aspect of the present invention.
Figure 14E:
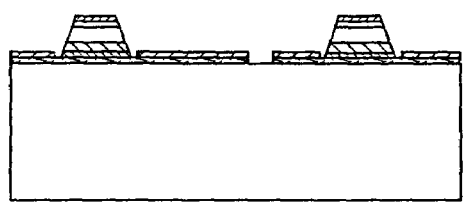
Figure 14B:
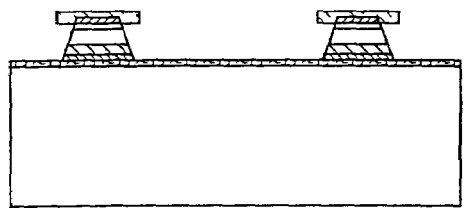
Figure 14F:
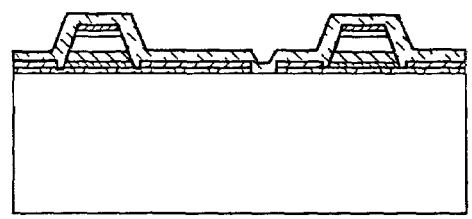
Figure 14C:
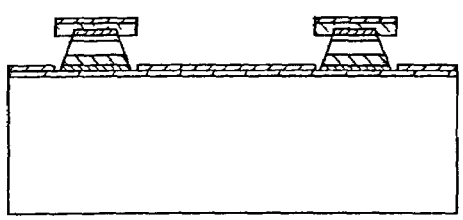
Figure 14G:
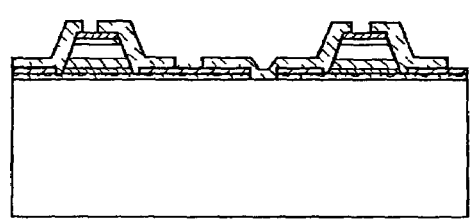
Figure 14D:
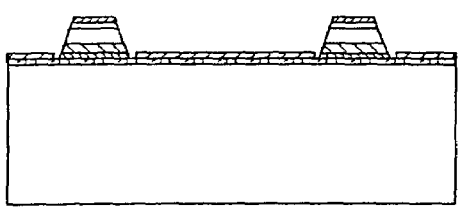
Figure 14H:
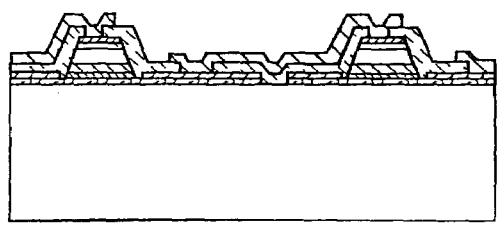

Referring now to FIGS. 14A-14H, there is shown a double-ridge VECLAE system (analogous to that described in FIG. 6) at various processing steps according to an aspect of the present invention. Wafer processing commences after epi-taxial growth with patterning the p-contact metal by lift-off, followed by the deposition and etching of plasma-enhanced chemical vapor deposition (PECVD) silicon nitride (FIG. 14A). Two photolithography processes may be employed. Silicon nitride may be used as an etch mask to delineate the ridge waveguides. The etch depth may be defined by a thin $In_{0.5}Ga_{0.5}P$ etch stop layer that is lattice-matched to GaAs but has different etch properties. A hydrogen peroxide-ammonium hydroxide solution may be used to etch the GaAs and AlGaAs layers above this etch stop but not the $In_{0.5}Ga_{0.5}P$ etch stop itself. A dilute HCl solution may be used to etch the $In_{0.5}Ga_{0.5}P$ but not the n-contact layer underneath it (FIG. 14B). The n-contact metals may then be evaporated, taking advantage of the undercut of the semiconductor waveguide relative to the silicon nitride etch mask to ensure that the metal does not contact the sidewalls of the ridge (FIG. 14C). The unwanted metal on top of the ridge may be removed by a lift-off process, by dissolving the silicon nitride in an HF solution (FIG. 14D) for example. Next, the ridges may be electrically isolated by etching the n-contact metal with ion milling and the underlying n-contact layer with hydrogen peroxide-ammonium hydroxide etching (FIG. 14E) using a photoresist mask that is not shown. A layer of silicon nitride insulation may be deposited over the entire wafer (FIG. 14F) and contact vias etched to the p-contact metal and the n-contact metal (FIG. 14G). Finally, interconnect metal may be deposited either by lift-off or by selective area electroplating to connect the anode of one laser ridge to the cathode of its neighbor (FIG. 14H). The interconnect metal can form bond pads at the two ends in a string of serially-connected diodes. The process may continue following standard laser processing with substrate thinning, cleaving, facet coating and chipping, for example.

Figure 15:
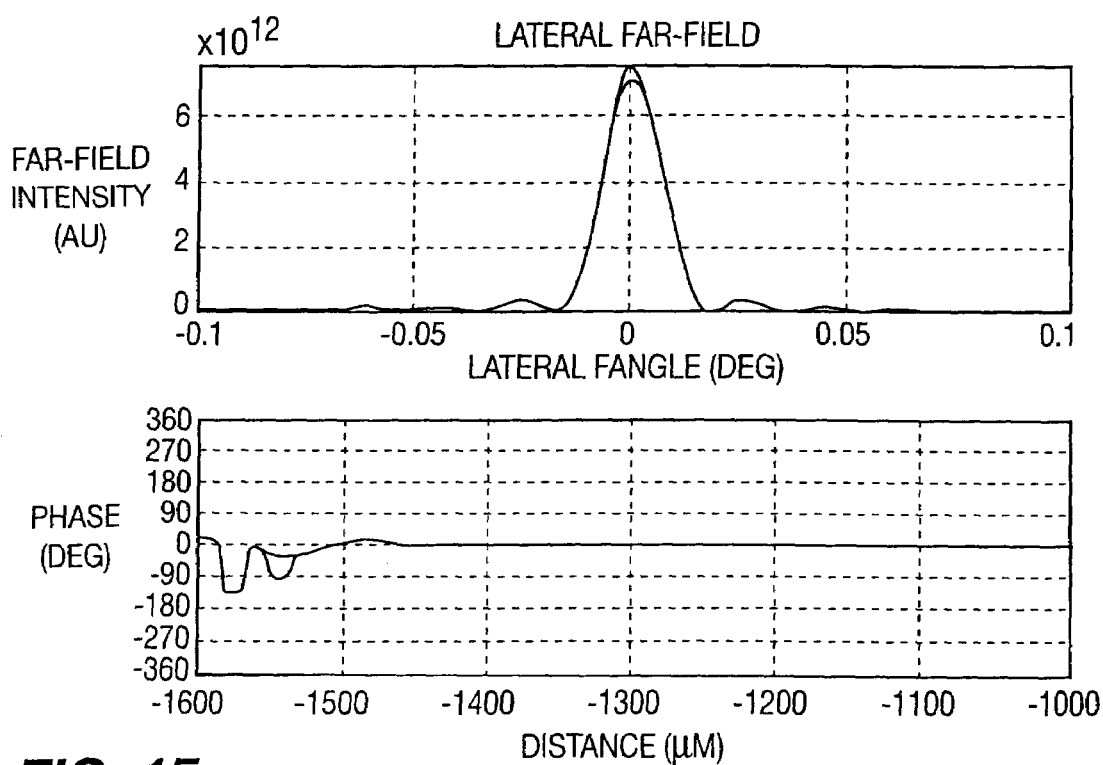

Referring finally to FIG. 15, there is shown a lateral far-field intensity distribution vs. angle (the lower curve) for a 200-ridge, 30 mm VECLAE. The upper curve shows diffraction from a 3.2 mm rectangular aperture, suggesting the diffraction limit. As should be understood by those possessing an ordinary skill in the pertinent arts, the far-field profile is very close to the diffraction limit with 99% of the 600 W power falling within the first pair of nulls of the diffraction curve. Referring still to FIG. 15, there is also shown a near-field phase for a left edge of the cavity. The phase deviations that are seen therein are believed to correspond to the eight leftmost waveguides, due to filaments induced by carrier/thermal instability. However, these phase deviations may be seen to stabilize rapidly as a function of distance.

It will be apparent to those skilled in the art that various modifications and variations may be made in the apparatus and process of the present invention without departing from the spirit or scope of the invention. Thus, it is intended that the present invention cover the modification and variations of this invention provided they come within the scope of the appended claims and their equivalents.

What is claimed is:

1. A high power laser system comprising:
a plurality of emitters each comprising:
an undoped large area waveguide region devoid of quantum well structure;
a plurality of ridge waveguide structures positioned separate from and overlaying said large area waveguide region; and
at least one quantum well structure formed only in each ridge waveguide structure, each at least one quantum well structure being separated from said undoped large area waveguide region by a doped lower cladding layer positioned substantially therebetween, each ridge waveguide structure and doped lower cladding layer having overlying contacts, the contacts at least partially overlying an upper surface of the undoped large area waveguide region, said undoped large area waveguide region and said at least one quantum well structure cooperating to amplify light of a single spatial mode determined by combination of said plurality of ridge waveguide structures and said undoped large area waveguide region;
a collimator optically coupled to said emitters;
a diffraction grating optically coupled through said collimator to said emitters; and,
an output coupler optically coupled through said diffraction grating to said emitters.

2. The system of claim 1, wherein said plurality of emitters comprises around 100.

3. The system of claim 1, further comprising a plurality of coolers, each being thermally coupled to at least one corresponding emitter.

4. The system of claim 3, wherein said emitters are continuous wave emitters.

5. The system of claim 1, wherein each of said emitters comprises about 100 ridge waveguide structures or more.

6. The system of claim 1, wherein each of said plurality of ridge waveguide structures is a single quantum well containing structure.

7. The system of claim 1, wherein a lateral spacing across each of said at plurality of ridge waveguide structures is greater than 5 micrometers.

8. The system of claim 1, wherein said collimator is suitable for aligning emissions from said emitters at the diffraction grating.

9. The system of claim 8, wherein said grating angularly combines spatially separated components of the emissions into a single, uniform propagation direction.

10. The system of claim 9, wherein the output coupler provides optical cavity feedback and system output.

11. The system of claim 1, wherein each of said emitters provides optical powers between about 100 and 1000 W.

12. The system of claim 1, wherein said emitters comprise an InGaAs/AlGaAs material system.

13. The system of claim 1, wherein each of said emitters are Continuous wave emitters.

14. A Continuous wave optical energy emitter comprising:
at least one quantum well layer formed within each of a plurality of ridge waveguide structures;
undoped large area waveguide region devoid of quantum well structure and positioned separate from and substantially underlying at least one quantum well layer formed within each of the plurality of ridge waveguide structures, each at least one quantum well layer being separated from said undoped large area waveguide region by a doped lower cladding layer positioned substantially therebetween, each ridge waveguide structure and doped lower cladding layer having overlying contacts, the contacts at least partially overlying an upper surface of the undoped large area waveguide region, said undoped large area waveguide region and said at least one quantum well layer cooperating to amplify light of a single spatial mode determined by combination of said each of the plurality of ridge waveguide structures and said undoped large area waveguide region, wherein said at least one quantum well layer exhibits a low modal overlap with said single spatial mode; and,
a cooler thermally coupled to said at least one quantum well layer.

15. The emitter of claim 14, wherein a lateral spacing across each of said plurality of ridge waveguide structures is greater than 5 micrometers.

16. The emitter of claim 14, wherein said overlap is less than or equal to about 0.1%.

17. The system of claim 1, wherein said spoiler layer is composed of AlGaAs.

18. The emitter of claim 1, wherein the spoiler layer is composed of AlGaAs.

19. The system of claim 1, wherein said at least one quantum well structure exhibits a low modal overlap with said single spatial mode.

20. The system of claim 19, wherein said overlap is less than or equal to about 0.1%.

21. The system of claim 1, wherein said single spatial mode exhibits low optical loss.

22. The system of claim 21, wherein said optical loss is equal to or less than about 0.3/cm.

23. A high power laser system comprising:
a plurality of emitters each comprising:
a large area waveguide region devoid of quantum well structure;
at least one ridge waveguide structure positioned separate from and overlaying said lame area waveguide region;
at least one quantum well structure formed only in said at least one ridge waveguide structure, said large area waveguide region and said at least one quantum well structure cooperating to amplify light of a single optical mode determined by combination of said at least one ridge waveguide structure and said large area waveguide region;
a substantially undoped cladding layer substantially underlying said large area waveguide region; and
a substrate substantially underlying said substantially undoped cladding layer;
a collimator optically coupled to said emitters;
a diffraction grating optically coupled through said collimator to said emitters; and,
an output coupler optically coupled through said diffraction grating to said emitters wherein said at least one ridge waveguide structure further comprises:
a first barrier layer at least partially underlying said at least one quantum well structure;
a second barrier layer at least partially overlying said at least one quantum well structure;
at least one first graded waveguide layer at least partially underlying said first barrier layer;
at least one second graded waveguide layer at least partially overlying said second barrier layer;
a p-doped cladding layer at least partially overlying said at least one second graded waveguide layer;

an intermediate graded layer at least partially overlying said p-doped cladding layer; and a contact layer at least partially overlying said intermediate graded layer.

24. The system of claim 23, wherein said undoped cladding layer further comprises a spoiler layer, wherein said spoiler layer determines whether the large area waveguide region operates in a fundamental transverse optical mode, discriminating against higher order transverse optical modes.

25. The system of claim 23, wherein said at least one graded waveguide layer, said at least one second graded layer, and said intermediate graded layer are graded substantially linearly and transversely with respect to the at least one ridge waveguide structure, doping concentration being lower in proximity to said quantum well region.

26. A high power laser system comprising:

a plurality of emitters each comprising:

an undoped large area waveguide region devoid of quantum well structure;

a plurality of ridge waveguide structures positioned separate from and overlaying said undoped large area waveguide region;

each of said plurality of ridge waveguide structures being of smaller lateral width than said undoped large area waveguide region, each of said plurality of ridge waveguide structures being bounded laterally by materials of lower refractive index than materials within each of said plurality of ridge waveguide structures said through which light substantially propagates; and at least one quantum well structure formed only in each ridge waveguide structure, said at least one quantum well structure being separated from said undoped lame area waveguide region by a doped lower cladding layer positioned substantially therebetween, each ridge waveguide structure and doped lower cladding layer having overlying contacts, the contacts at least partially overlying an upper surface of the undoped large area waveguide region, said undoped large area waveguide region and said at least one quantum well structure cooperating to amplify light of a single spatial mode determined by combination of said plurality of ridge waveguide structures and said undoped large area waveguide region;

a collimator optically coupled to said emitters;

a diffraction grating optically coupled through said collimator to said emitters; and, an output coupler optically coupled through said diffraction grating to said emitters.

27. The system of claim 26, wherein said at least one quantum well structure exhibits a low modal overlap with said single spatial mode.

* * * * *